United States Patent
Ashdown et al.

(10) Patent No.: US 11,080,441 B2
(45) Date of Patent: Aug. 3, 2021

(54) SUPERVISED TRAINING DATA GENERATION FOR INTERIOR ENVIRONMENT SIMULATION

(71) Applicant: Suntracker Technologies Ltd., Victoria (CA)

(72) Inventors: Ian Edward Ashdown, West Vancouver (CA); Wallace Jay Scott, Victoria (CA); Callum Thomas, Victoria (CA)

(*) Notice: Subject to any disclaimer, the term of this patent is extended or adjusted under 35 U.S.C. 154(b) by 464 days.

(21) Appl. No.: 16/158,267

(22) Filed: Oct. 11, 2018

(65) Prior Publication Data
US 2019/0114376 A1    Apr. 18, 2019

Related U.S. Application Data

(60) Provisional application No. 62/571,380, filed on Oct. 12, 2017, provisional application No. 62/719,973, filed on Aug. 20, 2018.

(51) Int. Cl.
*G06F 30/20*      (2020.01)
*G06N 3/02*       (2006.01)
(Continued)

(52) U.S. Cl.
CPC ............ *G06F 30/20* (2020.01); *G06F 30/17* (2020.01); *G06K 9/6256* (2013.01); *G06N 3/02* (2013.01);
(Continued)

(58) Field of Classification Search
CPC ......... G06F 30/20; G06F 30/17; G06N 20/00; G06N 20/10; G06N 20/20; G06N 3/02;
(Continued)

(56) References Cited

U.S. PATENT DOCUMENTS

| 9,078,299 B2 | 7/2015 | Ashdown |
| 2014/0052421 A1* | 2/2014 | Allen ............... G05B 17/02 703/2 |

(Continued)

OTHER PUBLICATIONS

Darcie Chinnis & Gregor P. Henze (2012), A Comparison of Lighting Energy Modeling Methods to Simulate Annual Energy Use and Peak Demand, Leukos (The Journal of the Illumanating Engineering Society of North America), Sep 16, 2013, 109-126, http://dx.doi.org/10.1582/LEUKOS.2012.09.02.003.

(Continued)

*Primary Examiner* — Shane D Woolwine

(57) ABSTRACT

A dense array of sensors positioned in a virtual environment is reduced to a sparse array of sensors in a physical environment, which provides sufficient information to a controller that responds to environmental conditions and parameters in the physical environment in substantially the same manner as it would to the same environmental conditions and parameters in the equivalent virtual environment. Data from a sparse array of virtual sensors is correlated with data from a dense array of virtual sensors and is used for generating control signals for hardware devices that influence a real or virtual interior environment. The correlated data and the control signals are used to train an artificial intelligence based controller that then controls the values of the parameters of the interior environment. A model of the interior environment is created using basic parameters in a computer-aided design application.

22 Claims, 9 Drawing Sheets

(51) Int. Cl.

| | |
|---|---|
| *G06N 5/04* | (2006.01) |
| *G06K 9/62* | (2006.01) |
| *G06N 20/00* | (2019.01) |
| *G06F 30/17* | (2020.01) |
| *G06N 3/08* | (2006.01) |
| *G06N 3/04* | (2006.01) |
| *G06N 5/02* | (2006.01) |
| *G05B 13/04* | (2006.01) |
| *G06K 9/00* | (2006.01) |

(52) U.S. Cl.
CPC .............. *G06N 3/0427* (2013.01); *G06N 3/08* (2013.01); *G06N 5/046* (2013.01); *G06N 20/00* (2019.01); *G05B 13/048* (2013.01); *G06K 9/00201* (2013.01); *G06N 5/022* (2013.01)

(58) Field of Classification Search
CPC .......... G06N 3/08; G06N 3/0427; G06N 5/02; G06N 5/022; G06N 5/046; G06K 9/6256; G06K 9/00201; H05B 47/10; H05B 47/105; H05B 47/11; H05B 47/115; H05B 47/12; H05B 47/125; H05B 47/13; G05B 13/048; F24F 2110/00; F24F 2110/10; F24F 2110/12; F24F 2110/20; F24F 2110/22; F24F 2110/50; F24F 2110/70; F24F 2130/00; F24F 2130/10; F24F 2130/20; F24F 2130/30; F24F 2130/40
See application file for complete search history.

(56) References Cited

U.S. PATENT DOCUMENTS

2017/0046497 A1* 2/2017 Ramesh ................ G16H 40/67
2018/0011954 A1* 1/2018 Micks .................... G06F 30/15

OTHER PUBLICATIONS

Ledalite, Ergolight Controls System Specifications, 2007, Ledalite Architectural Products, L0187 Rev.2.

Heschong Mahone Group, Inc., Sidelighting Photocontrols Field Study—Final Report Nov. 1, 2005, March 14, 2016.

J. Alstan Jakubiec & Christoph F. Reinhart (2016) A Concept for Predicting Occupants' Long-Term Visual Comfort within Daylit Spaces, LEUKOS, Nov. 30, 2015, 185-202, http://dx.doi.org/10.1080/15502724.2015.1090880.

Philips Lighting North America Corporation & Philips Lighting Canada Ltd., Savings, control, and comfort without complexity, Jun. 2017.

Philips Lighting North America Corporation & Philips Lighting Canada Ltd., SWZDT SpaceWise Wireless technology with dwell time functionality, SWZDT_sensor Jun. 2017 p. 1-7 of 7.

Reinhart, C.F., Lightswitch—2002: A Model for Manual and Automated Control of Electric Lighting and Blinds, Solar Energy, 77:1 pp. 15-28, 2004.

Oliver Walkenhorst, Joachim Luther, Christoph Reinhart & Jens Timmer, Dynamic Annual Daylight Simulations Based on One-Hour and One-Minute Means of Irradiance Data, Solar Energy vol. 72, No. 5, pp. 385-395, 2002, Published by Elsevier Science Ltd.

* cited by examiner

GreenhouseDesigner

Greenhouse

Roof Style: Arch
Bay Length: 16
Bay Width: 16
Number of Bays (Length): 8
Number of Bays (Width): 4
Wall Height: 16
Peak Height: 20
Column Spacing: 1
Arch Radius: 10
Arch Offset: 0
Number of Horz Panels (Length): 4
Number of Horz Panels (Width): 4
Number of Vertical Panels: 2

Luminaire Array

Luminaire Type: HPS Cylinder
Number of Luminaires (Length): 16
Number of Luminaires (Width): 8
Start Position (Length): 4
Start Position (Width): 4
Start Position (Height): 14
Spacing (Length): 8
Spacing (Width): 8
Rotation: 0

Roof Glazing

Transmittance: 0.9
Reflectance: 0
☐ Translucent

Material Reflectances

| | Red | Green | Blue |
|---|---|---|---|
| Ceiling: | 0.8 | 0.8 | 0.8 |
| Floor: | 0.2 | 0.2 | 0.2 |
| Frame: | 0.8 | 0.8 | 0.8 |
| Luminaire: | 0.9 | 0.05 | 0.05 |
| Table: | 0.5 | 0.5 | 0.5 |
| Tray: | 0.7 | 0.7 | 0.7 |
| Walls: | 0.8 | 0.8 | 0.8 |
| Plants: | 0.03 | 0.1 | 0.04 |

Wall Glazing

Transmittance: 0.9
Reflectance: 0
☐ Translucent

Tables

Length: 7.5
Width: 4
Height: 2.5
Plants: 8

Trays

Length: 7.5
Width: 4
Height: 2.5
Plants: 0.5

[Done] [Generate]

FIG. 9

SUPERVISED TRAINING DATA GENERATION FOR INTERIOR ENVIRONMENT SIMULATION

TECHNICAL FIELD

The subject matter of the present invention relates to the modeling and performance simulation of interior environments, including those of horticultural, agricultural, and architectural buildings, as a means of generating training data for artificial intelligence (AI) based environmental control systems.

BACKGROUND

The introduction of computer and sensor technologies has recently transformed the operation and management of interior environments, including those of horticultural, agricultural, and architectural buildings. For horticultural buildings such as greenhouses and enclosed vertical farms, the growth and health of crops and ornamental plants can be continuously monitored, and environmental parameters and conditions such as lighting, air and soil temperature, humidity, air flow, and carbon dioxide concentration can be continually adjusted for optimal performance. Similarly, for agricultural buildings such as livestock barns and architectural buildings such as schools and offices, the actions and behaviour of occupants can be continuously monitored, and environmental parameters and conditions such as lighting, air temperature, humidity, and air flow can be continually adjusted for occupant comfort and energy efficiency.

For horticultural applications, neural networks and related AI technologies can be trained to recognize temporal trends in plant growth and health in response to given environmental factors, and so autonomously learn the optimal conditions needed to achieve performance goals such as maximum crop yield or ornamental plant health. Similarly, for agricultural and architectural applications, such AI technologies can be trained to recognize temporal trends in occupant actions and behaviour in response to given environmental factors, and so autonomously learn the optimal conditions needed to achieve performance goals such as occupant comfort and energy efficiency.

However, the training data is necessarily limited to that provided by sensors in the environment. For economic and practical reasons, this data can be exceedingly sparse, such as for example one daylight photosensor and one temperature sensor to measure the lighting and air temperature within an entire greenhouse or open office. The placement of such sensors is therefore critical if even approximate average data is to be obtained.

Taking daylight harvesting controllers such as disclosed in U.S. Pat. No. 9,078,299 as an example, environmental control systems can be difficult to commission. In practice, the lighting designer typically chooses a convenient position on the ceiling for the daylight photosensor and specifies that only luminaires near windows need be dimmed or switched. Once installed, the electrical contractor visits the site once on a clear day and once at night to adjust the controller setpoints and ensure that the system is functioning correctly. Not surprisingly, a study of over 100 installed systems (HMG, 2005, Sidelighting Photocontrols Field Study, Heschong-Mahone Group, Fair Oaks, Calif.) found that over half of the installed system failed to perform as designed.

Another problem is that the room illuminance measured by the daylight photosensor is often poorly correlated with the interior distribution of direct sunlight and diffuse daylight, which varies throughout the day and year in accordance with solar position and changing weather conditions. Worse, the set of luminaires which can be dimmed or switched to compensate for the daylight distribution is usually fixed at design time. Designating a set of luminaires to be connected to a single electrical circuit and controlled as a group often results in suboptimal performance.

One possible solution is to provide each luminaire with its own daylight photosensor, such as was implemented in the Ledalite Ergolight® Controls system (Ledalite Architectural Products, Langley, Canada), and which is currently provided by Philips EasySense® products (Philips Lighting North America Corporation, Rosemont, Ill.). However, while these devices can be remotely monitored by a central network, they are designed to dim or switch individual luminaires. It is therefore possible, for example, for adjacent luminaires to continually compete with each other in attempting to maintain a constant light level by alternately increasing or decreasing their luminous flux output.

More generally, neither of these approaches to daylight harvesting enable the luminaires to perform as an integrated system, wherein each networked luminaire may be individually dimmed or switched in order to maintain a target illuminance distribution in the illuminated space while considering both daylight and electric lighting, and while also minimizing energy consumption.

It is further desirable to have a networked lighting system wherein motorized blinds may be deployed to limit direct sunlight ingress and so minimize the occurrence of visual glare, without the need for predetermined blinds operation schedules. Unfortunately, this is generally not possible with the limited information available from a single photosensor.

This example of a daylight harvesting controller responsive to the distribution of visible light in a controlled architectural environment is one example, but it is obvious that the problem of sensor quantity and placement within the environment applies to many different environmental conditions and parameters.

SUMMARY

One solution to this problem is to accurately model the physical environment and simulate its performance. If the virtual simulation includes representations of the physical sensors and can reasonably approximate their outputs over time, then a spatially dense array of virtual sensors can be used to provide both supervised training data for the artificial intelligence engine.

The virtual simulation serves two purposes. During the design phase of an interior environment, the simulation can be used to generate supervised data to train a virtual AI-based controller to operate the simulation in accordance with predefined performance goals and environmental conditions. For example, a greenhouse may need to deploy energy curtains in the summer to limit the amount of daylight received by the plants, and in the winter to limit heat loss through the greenhouse glazing while maximizing available daylight and so minimizing supplemental electric lighting usage. Similarly, it may be necessary to deploy motorized shades in an office or schoolroom to alleviate visual glare or excess solar insolation while still minimizing supplemental electric lighting usage.

Following the construction of the physical building, the virtual AI-based controller data (e.g., the synaptic weights of a trained neural network) may be transferred to an equivalent physical AI-based controller, which can then be used to monitor and control the physical environment. The simulation continues to play a role in simulating the performance of the physical environment in response to real-time data obtained from a sparse array of physical sensors, and so providing a dense dataset for its virtual sensors as supervised data to continually train the AI-based controller for optimal performance.

One of the challenges of implementing this solution is the need to accurately model the physical environment. While it is possible to model horticultural, agricultural, and architectural buildings using computer-aided drafting (CAD) programs such as Autodesk Revit® or Trimble SketchUp® Pro, it requires an inordinate amount of knowledge and experience to design CAD models that are sufficiently detailed for the purpose, but without extraneous detail that makes it difficult for the simulation program to be executed in reasonable time as required for training the AI-based controller.

A further complication is that this knowledge and experience is distributed across a variety of disciplines. For example, in order to develop a greenhouse model, the designer needs to know the structural engineering requirements and practices of greenhouse construction, the optical and mechanical properties of glass and plastic glazing materials, horticultural lighting design principles and practices, mechanical engineering principles and practices, horticultural management principles and practices, and more. It is reasonable to assume that a large greenhouse manufacturer may be able to employ one or two designers with such knowledge and experience, but there is clearly a need for a system and method whereby a reasonably knowledgeable horticulturalist or greenhouse operator can simply specify the basic design parameters of a controlled environment structure such as a greenhouse, vertical farm, or building atria, whereupon a virtual CAD model with the appropriate geometry (i.e., structural components) and materials (particularly greenhouse glazing and plastic films, shades and energy curtains, supplemental electric lighting, heating, ventilation, and air conditioning (HVAC) equipment, and environmental sensors) is automatically generated in accordance with domain knowledge embedded in the design system.

Similar arguments may be made for agricultural or architectural buildings. Most livestock barns, for example, are geometrically simple to model. Architectural buildings are obviously more complex, but in many situations, it is sufficient to model individual office spaces and schoolrooms as simple rectangular rooms with regularly-arranged furniture such as office partitions and desks.

There is therefore a need for a system and method whereby a reasonably knowledgeable lighting or mechanical systems designer without CAD expertise can specify the basic design parameters of a controlled environment structure, such as a greenhouse, a vertical farm, an open office, or a schoolroom.

There is also a need for a system and method whereby a dense array of sensors positioned in a virtual environment can be reduced to a sparse array of sensors in a physical environment while providing a sufficient amount of information to an AI-based controller such that the controller responds to environmental conditions and parameters in the physical environment in substantially the same manner as it would to the same environmental conditions and parameters in the equivalent virtual environment.

The present invention includes a system and method for generating supervised training data for an interior environment simulation. The interior environment may be virtual or physical (real). Data from a sparse array of real or virtual sensors is correlated with data from a dense array of virtual sensors and is used for generating control signals for hardware devices that influence the interior environment. The data from the sparse and dense arrays and the control signals are used to train an AI-based controller that then controls the values of the parameters of the interior environment.

Disclosed herein is a system for automatically generating supervised training data for a control system for an interior environment, comprising computer-readable memory comprising computer-readable instructions defining a simulation module, which, when processor-executed, performs simulation calculations using a three-dimensional parametric computer-aided design (CAD) model of a virtual interior environment to determine spatial and temporal distributions of environmental conditions within the virtual interior environment; a sensors module, which, when processor-executed, simulates virtual sensors at specified positions within the virtual interior environment and calculates predicted environmental conditions at the specified positions; and a controls module, which, when processor-executed, generates output control signals for representations of virtual environmental control hardware within the virtual interior environment. The system includes a trainable artificial intelligence (AI) based controller that is trained by the predicted environmental conditions and the output control signals.

Also disclosed is a method of automatically generating supervised training data for a control system for an interior environment, comprising the steps of: performing, by a processor, simulation calculations using a three-dimensional parametric computer-aided design (CAD) model of a virtual interior environment to determine spatial and temporal distributions of environmental conditions within the virtual interior environment; simulating, by the processor, virtual sensors at specified positions within the virtual interior environment and calculating predicted environmental conditions at the specified positions; generating, by the processor, output control signals for representations of virtual environmental control hardware within the virtual interior environment; and training an artificial intelligence (AI) based controller for the interior environment using the predicted environmental conditions and the output control signals.

Further disclosed is a method of automatically generating supervised training data for a physical controlled environment control system comprising the steps of: obtaining measurements from a physical sensor array in the environment; calculating, using the obtained measurements, control outputs for physical control hardware that controls the environment; generating a set of spatially dense virtual sensor array values based on the obtained measurements, wherein the spatially dense virtual sensor array is more dense than the physical sensor array; and training a physical artificial intelligence based controller in the physical controlled environment control system using the obtained measurements and the generated set of spatially dense virtual sensor array values.

BRIEF DESCRIPTION OF DRAWINGS

FIG. 9 shows an example menu wherein a user may choose various greenhouse structure design parameters.

DETAILED DESCRIPTION

Figure 1:
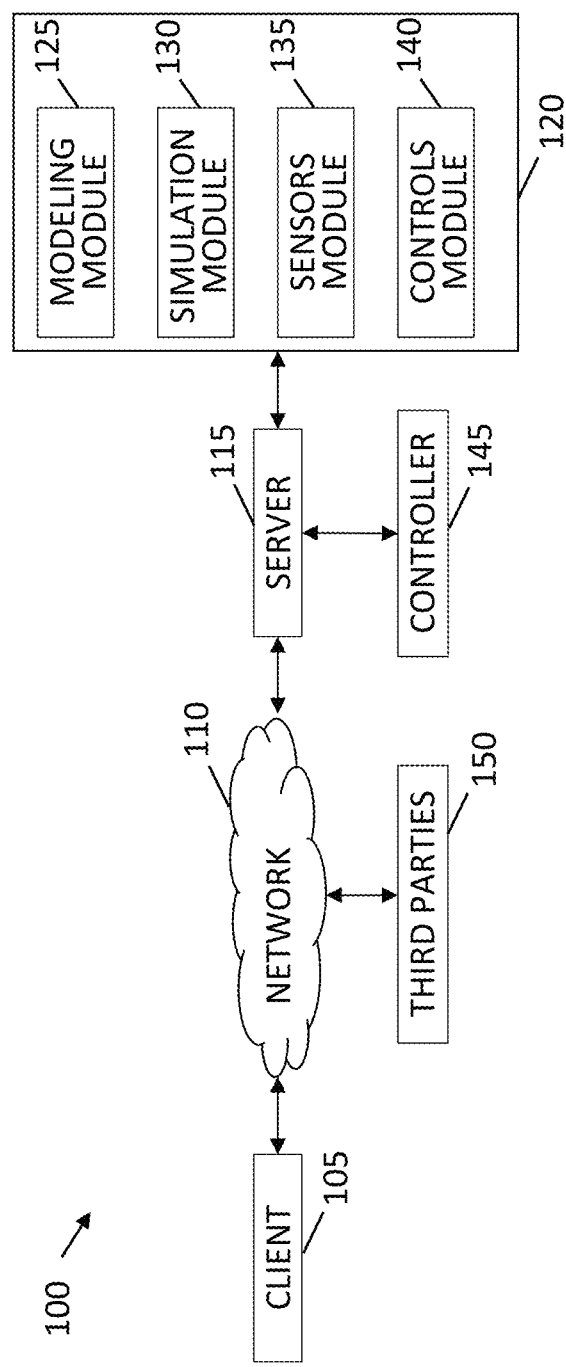
FIG. 1 shows a schematic diagram of a system for automatically generating supervised training data for a virtual AI-based controlled environment controller.

This detailed description of the invention focuses on the simulation and control of controlled environments in horticultural buildings. However, as will be evident to those skilled in the art, the principles disclosed herein are applicable without loss of generality to the simulation and control of controlled environments in agricultural and architectural buildings.

A. Glossary

Within the scope of this disclosure, a "sensor" may refer to any electrical, electronic, or electromechanical device that senses an environmental or temporal condition and generates a corresponding analog or digital electrical signal. Such devices may include, but are not limited to, illuminance and luminance sensors, irradiance and radiance sensors, photon flux density ("quantum") sensors, multispectral sensors, spectral irradiance and radiance sensors (i.e., spectroradiometers), chromaticity sensors, imaging sensors, hyperspectral imaging sensors, ultraviolet sensors, infrared sensors, air temperature sensors, soil temperature sensors, hygrometers, carbon dioxide sensors, anemometers, occupancy sensors, personal lighting controls, timers, and utility or co-generated power meters. The sensors may be located within the controlled environment or exterior to the environment, and include remotely-located sensors that transmit data to the controller, such as for example weather report feeds. Sensors may be virtual or physical.

A communications "network" may be comprised of a wired network, such as RS-485, DMX512, Ethernet, or PoE (Power over Ethernet), a wireless network such as Zigbee, BlueTooth, 6LowPan, an optical communications network using visible light or infrared radiation such as IrDA, or a combination thereof, and may be any communications network that can support the communications required in the present invention.

The term "optical radiation" refers to electromagnetic radiation with wavelengths within the range of approximately 100 nanometers to approximately 5000 nanometers, including ultraviolet radiation, visible light, and infrared radiation.

An "environmental condition" is any measurable condition within a physical environment or predicted condition within a simulated virtual environment. Examples include but are not limited to illuminance, irradiance, air temperature, soil temperature, humidity, and carbon dioxide concentration, as may be measured by a sensor.

An "environmental parameter" is any measurable parameter within a physical environment or predicted parameter within a simulated virtual environment. Examples include the luminous or radiant flux distribution of luminaires, direct solar and diffuse horizontal irradiance due to the sun and sky, ambient air temperature and humidity, and the flow of carbon dioxide from $CO_2$ enrichment systems.

An "interior environment" is an environment that is substantially separated from the surrounding exterior environment by materials that limit the interaction of environment conditions and parameters within the interior environment with environmental conditions and parameters in the exterior environment. For example, the walls, roof, and floor of a greenhouse would delimit an interior environment in that these materials limit the air flow through the interior environment from the exterior environment and so limit the dependence of the interior air temperature on the exterior environment air temperature.

The term "supervised training data" refers to a set of training examples, wherein each example is comprised of a pair of input and desired output data vectors. The goal of training the neural network or other artificial intelligence system is to infer a function that maps each training example input data vector to the desired output data vector. As an example, an input data vector may consist of predicted measurements from a spatial array of quantum sensors in a greenhouse, where the environmental parameters are direct sunlight, diffuse daylight, and optical radiation from supplemental electric lighting, and the output data vector elements are the minimum desired values for each sensor. The inferred function is therefore the set of control values for the supplemental electric lighting fixtures needed to maintain the minimum desired sensor values.

The term "clustering" refers to any artificial intelligence technique wherein a set of objects is grouped into a plurality of "clusters" such that objects within a given cluster are more similar to each other than to those in other clusters. As an example, a dense array of spatially-separated sensors may be grouped into clusters according to two criteria: 1) the sensors are spatially close to one another; and 2) the sensors exhibit similar measurement values, thereby resulting in a sparse array of spatially-separated sensors.

The term "module" refers to a set of computer-readable instructions stored in a tangible computer readable memory, which is embodied in software, firmware or hardware in a user device or a server.

The term "processor" is used to refer to any electronic circuit or group of circuits that perform calculations, and may include, for example, single or multicore processors, multiple processors, an ASIC (Application Specific Integrated Circuit), and dedicated circuits implemented, for example, on a reconfigurable device such as an FPGA (Field Programmable Gate Array). The processor performs the steps in the flowcharts, whether they are explicitly described as being executed by the processor or whether the execution thereby is implicit due to the steps being described as performed by an application, code or a module. The processor, if comprised of multiple processors, may be located together or geographically separate from each other. The term includes virtual processors and machine instances as in cloud computing or local virtualization, which are ultimately grounded in physical processors.

The terms "dense" and "sparse" when used in relation to sensor array mean that there is a greater density of sensors in the dense array than in the sparse array. For example only, the dense array may be 10-100 times as dense as the sparse array.

B. Virtual Controller

In a first embodiment, the invention comprises a system and method for automatically generating CAD models of controlled environments and generating supervised data for training a virtual AI-based controller.

As shown in FIG. 1, the system consists of a distributed computer system 100 wherein a client user interface 105 enables the user to specify a set of design parameters that describe the material and geometry of a virtual controlled environment such as, for example, a greenhouse. The client 105 is connected to a network 110, which may be an office intranet or an internet. Also connected to the network is a server 115, to which the client 105 sends the set of chosen design parameters.

The server 115 is logically connected to a set of software modules collectively identified as module container 120, which is further comprised of modeling module 125, simulation module 130, sensors module 135, and controls module 140.

The server 115 is further logically connected to virtual AI-based controller 145, which can be trained using the supervised data generated by module container 120.

Server 115 may further communicate with third parties 150 such as for example, greenhouse structure or horticultural luminaire manufacturers, through network 110. One purpose of such communications may be to obtain manufacturers' product information and associated data needed for the generation of a CAD model. Another purpose may be to enable the user to interface with the manufacturer under the supervision of the server 115 to, for example, obtain further product information or manufacturer's advice.

The server includes one or more processors and computer-readable memory, which stores computer-readable instructions in the form of an application or one or more modules. When executed by a processor, the application or modules implement the steps in the flow charts described herein, or otherwise provide at least some or all of the functionality of the present invention. The functionality of the present invention may alternately be provided in part or in whole by other components in the system 100.

Figure 2:
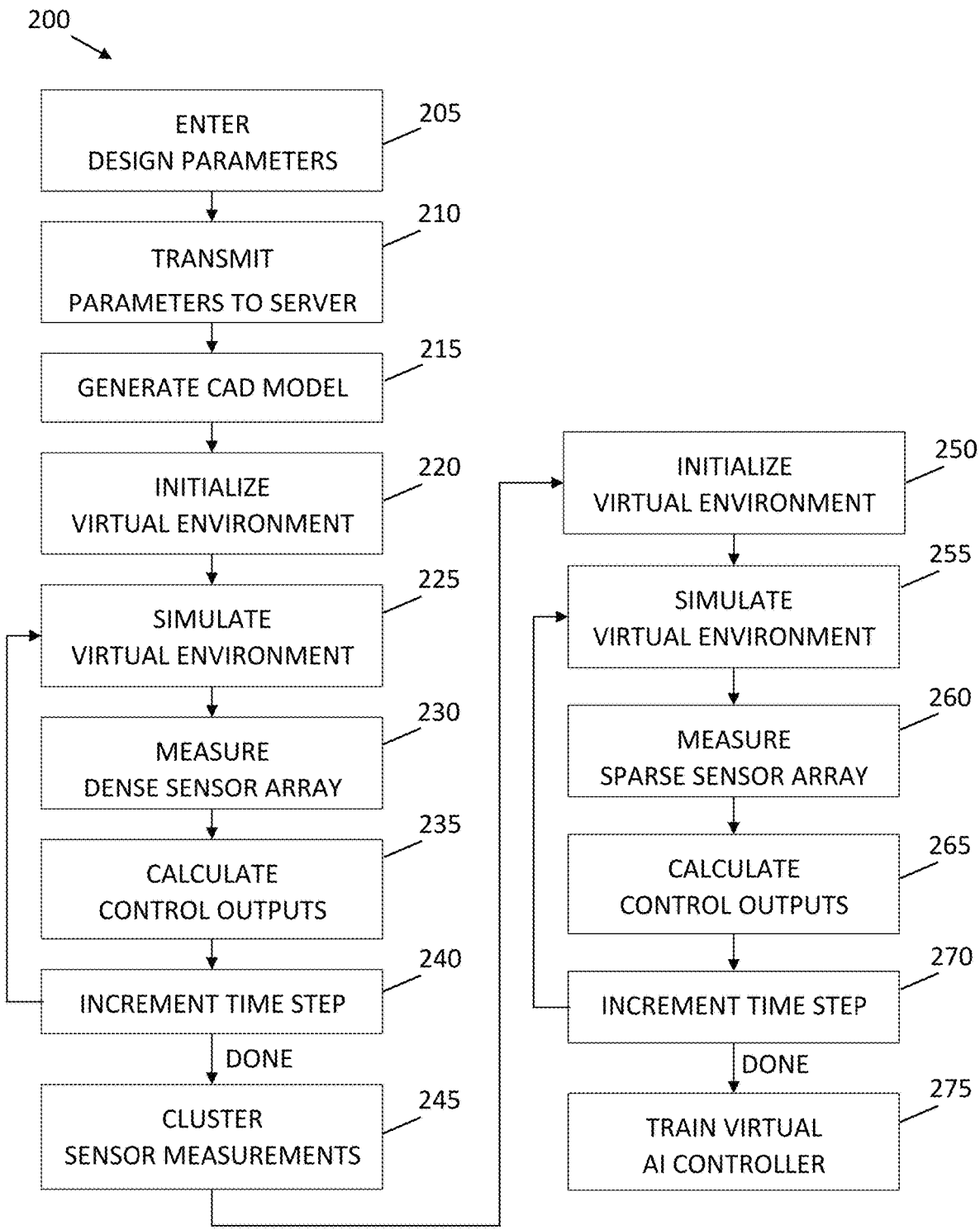
FIG. 2 shows a flow chart of a method for automatically generating supervised training data for a virtual AI-based controlled environment controller.

FIG. 2 shows a first method 200 of automatically generating supervised data for online training of a virtual AI-based controller for horticultural controlled environments. In Step 205, the client enters a set of desired design parameters through the user interface 105 of FIG. 1.

The user may be shown menus with a variety of design parameter options for a desired greenhouse or vertical farm. As an example, the design of a greenhouse structure typically involves one of six different designs as shown in FIGS. 3-8.

Figure 3:
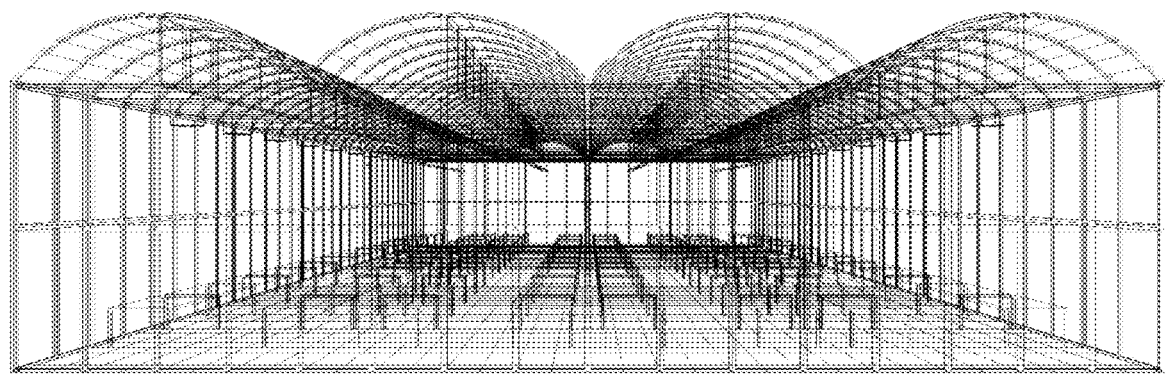
FIG. 3 shows a wireframe CAD model of an example arched roof greenhouse.

FIG. 3 shows an arched roof greenhouse, where the roof trusses have a substantially constant radius and are typically glazed with flexible plastic sheets or films rather than rigid glass. Such greenhouses are typically used as permanent structures in temperate climates.

Figure 4:
FIG. 4 shows a wireframe CAD model of an example arched tunnel greenhouse

FIG. 4 shows an arched tunnel greenhouse, where the arched support members have a substantially constant radius and are typically covered with flexible agricultural films such as polyethylene sheeting. Such greenhouses are often used as seasonal structures in semitropical climates, and are typically less than two meters in height.

Figure 5:
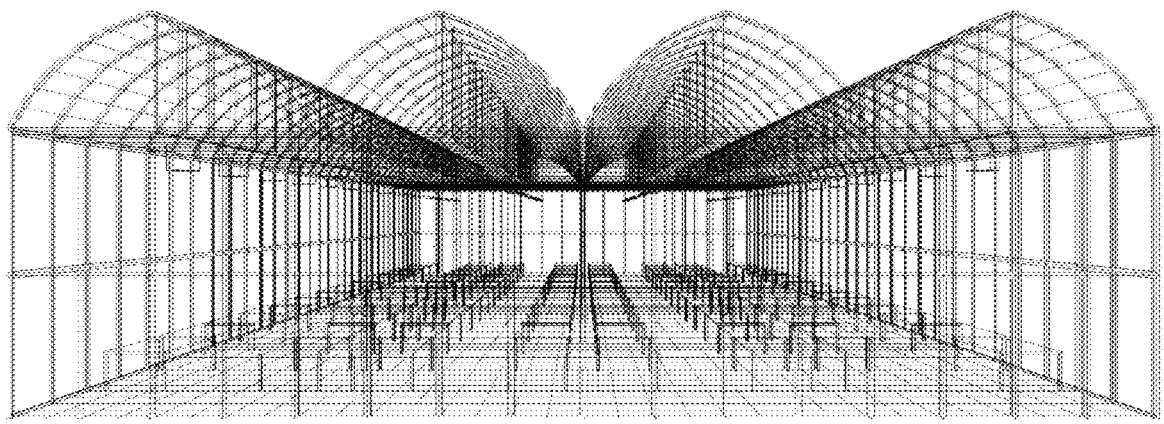
FIG. 5 shows a wireframe CAD model of an example Gothic roof greenhouse.

FIG. 5 shows a Gothic roof greenhouse, where the roof trusses are comprised of two opposing members with substantially constant radii and horizontally offset centers, and are typically covered with flexible plastic sheets, although semi-rigid glass panels may also be used. Such greenhouses are typically used as permanent structures in temperate climates.

Figure 6:
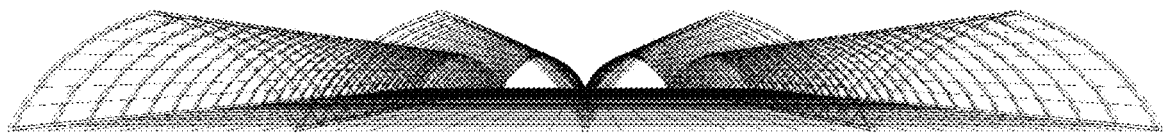
FIG. 6 shows a wireframe CAD model of an example Gothic tunnel greenhouse.

FIG. 6 shows a Gothic tunnel greenhouse, where the arched support members have a substantially constant radius and are typically covered with flexible agricultural films such as polyethylene sheeting. Such greenhouses are often used as seasonal structures in both semitropical and temperate climates, and are typically more than two meters in height.

Figure 7:
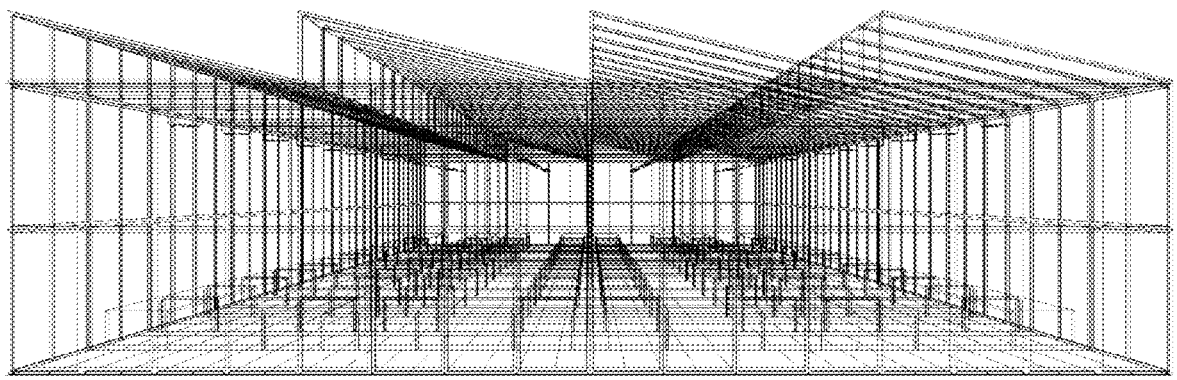
FIG. 7 shows a wireframe CAD model of an example sawtooth roof greenhouse.

FIG. 7 shows a sawtooth roof greenhouse, where the roof trusses have a constant slope chosen to maximize the transmission of direct sunlight through rigid glass panels through the year. Such greenhouses are typically used as permanent structures in temperate climates, often with the greenhouses oriented along the east-west axis for alignment with the daily solar path.

Figure 8:
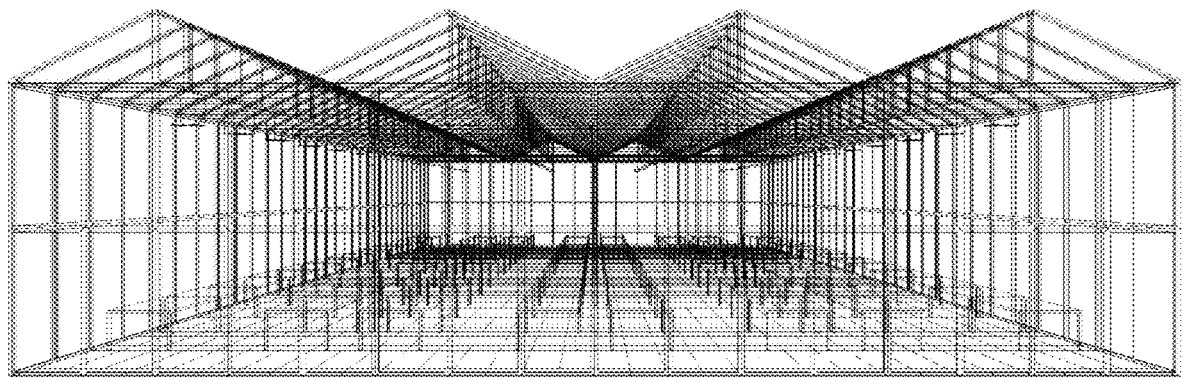
FIG. 8 shows a wireframe CAD model of an example "Venlo" style roof greenhouse.

FIG. 8 shows a "Venlo" style roof greenhouse (named after the Dutch horticultural municipality of Venlo), wherein the triangular roof trusses are most often glazed with rigid glass or plastic sheets that are designed to resist snow loads. Such greenhouses are typically used as permanent structures in temperate climates.

Each of these designs involves a considerable amount of expertise and knowledge in the design and fabrication of greenhouse structures, involving structural engineering and materials, cladding materials, foundations and floor materials, wind and snow load calculations, and more. However, most of this information can be embodied as domain knowledge in a parametric CAD design program. More important, this domain knowledge can be hidden from the user, who only needs to specify the basic parameters such as building dimensions, glazing materials, and luminaires of the desired greenhouse structure.

FIG. 9 shows an example menu that may be presented to the user via the client user interface 105 of FIG. 1, wherein the user may choose the roof style as shown in FIGS. 3-8. Large greenhouse are typically divided into "bays" along their length and width. For example, FIGS. 3-8 each show greenhouse structures with four bays across their width (facing the viewer) and multiple bays along their length. The user may therefore specify the bay length and width, and also the number of bays along the length and width of the structure. The design program can easily place limits on the entered parameters such that they do not exceed predetermined design limits or are otherwise to the greenhouse manufacturers' product specifications.

Apart from the tunnel designs (FIGS. 4 and 6), the greenhouse structures have walls whose height the user can specify, again according to predetermined limits as set by the design program. In addition, the roof peak height is the maximum height of the structure as determined by the roof style.

For large greenhouses with multiple bays across the structure width, it is typically necessary for the roof trusses to be supported by columns at regular intervals, typically one per bay along the length. However, the user may be given the option to change this, subject to structural engineering design constraints that may be determined by roof truss and glazing materials, as well as wind and snow loads.

For Gothic roof and tunnel greenhouses, one simple way to specify the structural design for the trusses or supports is to specify the arch radius and horizontal offsets of the two opposing arch segments. Of course, more sophisticated designs can be specified with a drop-down menu offering the user various manufacturer product options.

For each bay across the length and width of the building structure, the number of glazing panels may be specified, as well as the number of vertical panels. In the examples shown in FIGS. 3, 5, 7, and 8, there are four panels per bay horizontally and two panels vertically, commensurate with the maximum recommended size of the rigid glass glazing panels and structural engineering concerns.

Using the same menu approach, it is also possible to specify arrays of supplemental electric lighting luminaires, as shown in FIG. 9. Having selected to appropriate luminaires from a manufacturer's catalog, the user need only specify the number of luminaires along the length and width of the array, the start position of the array (including mounting height), and the spacing between the luminaires along the length and width of the array. A similar approach can be used to specify array of planting tables or trays, as shown in FIGS. 3, 5, 7, and 8, as well as shades and energy curtains (not shown), and also any mechanical equipment (also not shown).

As with the greenhouse structure, the design program can place limits on the entered values such that, for example, reasonable limits of electric lighting are enforced.

Finally, the user may specify glazing materials (rigid or flexible glass panels, rigid or flexible plastic panels, or flexible plastic films), typically by choosing appropriate products from manufacturers' catalogs, and again guided and constrained by the greenhouse manufacturer's requirements and recommendations.

A particular advantage of this menu-based approach for client user input is that the client has no need to have any particular skills in CAD model drafting, structural engineering design, horticultural lighting design, or other expertise and knowledge. These requirements, typically met by the greenhouse manufacturer's salespeople and design engineers, can be embodied in the design program itself.

Another particular advantage of this approach is that the client user interface 105 of FIG. 1 can be a "thin client" in distributed networks parlance, a computer with minimal resources that is connected to a more powerful server 115. For example, client user interface 105 can be a smartphone or tablet computer that is connected to remote server 115 via a wired or wireless internet network 110.

Yet another advantage of the thin client approach is that the design program logic and calculations can be performed as needed by a software program executing on the server 115 or by a script-based program that is downloaded to the client 105 on demand, with no need for the user to install application-specific software on the client device.

Once the user is satisfied with the selected design parameters, they are transmitted from user interface 105 through network 110 to server 115 in Step 210 of FIG. 2.

In Step 215, modeling module 125 of FIG. 1 generates a CAD model as a virtual representation of the horticultural controlled environment. A particular advantage of this approach is that the modeling module can generate two or more CAD models, such as for example a wireframe or 3D solid model for delivery to the client 105 to be displayed using a Web-based graphical display technology such as WebGL™, and a finite element model suitable for daylighting and supplemental electric lighting calculations, or for computational fluid dynamics (CFD) analysis for air flow and heat transfer.

The modeling task performed by modeling module 125 is a variant of 3D CAD parametric modeling wherein the basic building structure must be stretched in length, width, and height to satisfy user dimensional constraints, but must still maintain specific dimensions for roof truss members, support columns, and panel mullions.

Figure 10:
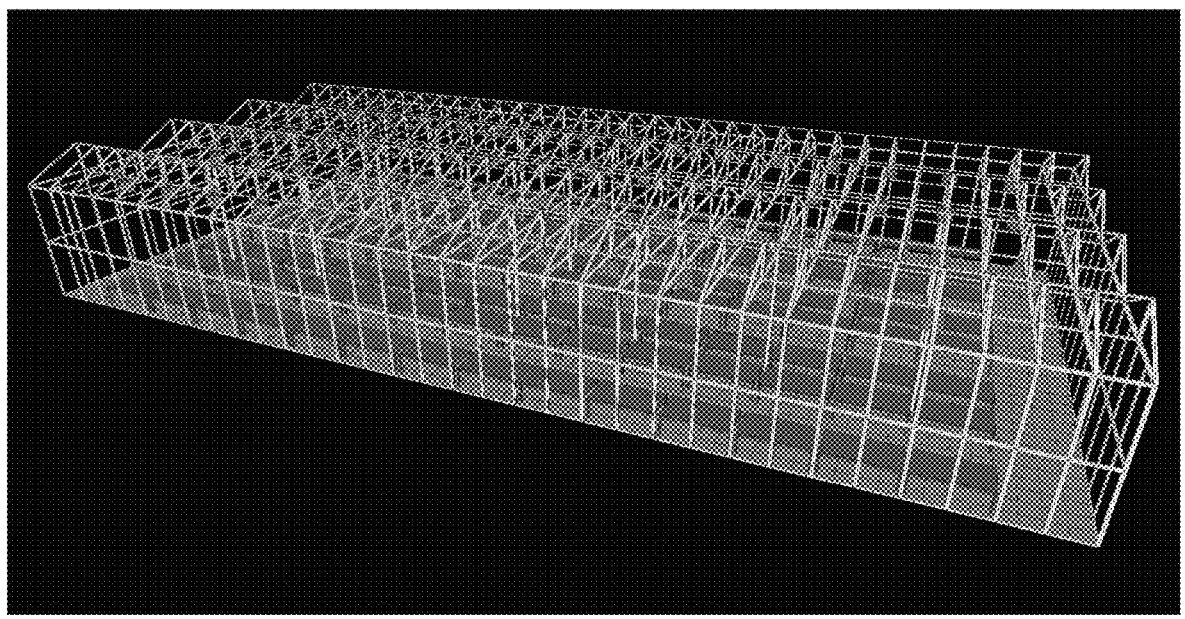
FIG. 10 shows a perspective view of a 3D solid model rendering of a Venlo roof greenhouse.

With the ability to display the building structure generated by modeling module 125 on the remote client 105 as a wireframe or 3D solid model using for example WebGL™, the user has the opportunity to visually inspect and approve the design before it is submitted to the simulation module 130. (FIG. 10 shows a perspective view of 3D solid model rendering of an example Venlo roof greenhouse design as might be displayed on the client user interface.) If necessary, the user can iterate through different design options until the desired green structure is generated.

In Step 220, the virtual environment is initialized with the initial environment parameters and the initial time step.

In Step 225, the simulation module 130 may accept one of more virtual representations of the controlled environments specified by the user and perform simulation calculations upon them, such as for example radiosity or ray-traced lighting calculations to determine the distribution of optical radiation from the specified luminaires within the environment. Distribution of other environment parameters and conditions, such as for example air and soil temperature, humidity, air flow, and carbon dioxide concentration, may also be calculated.

Figure 11:
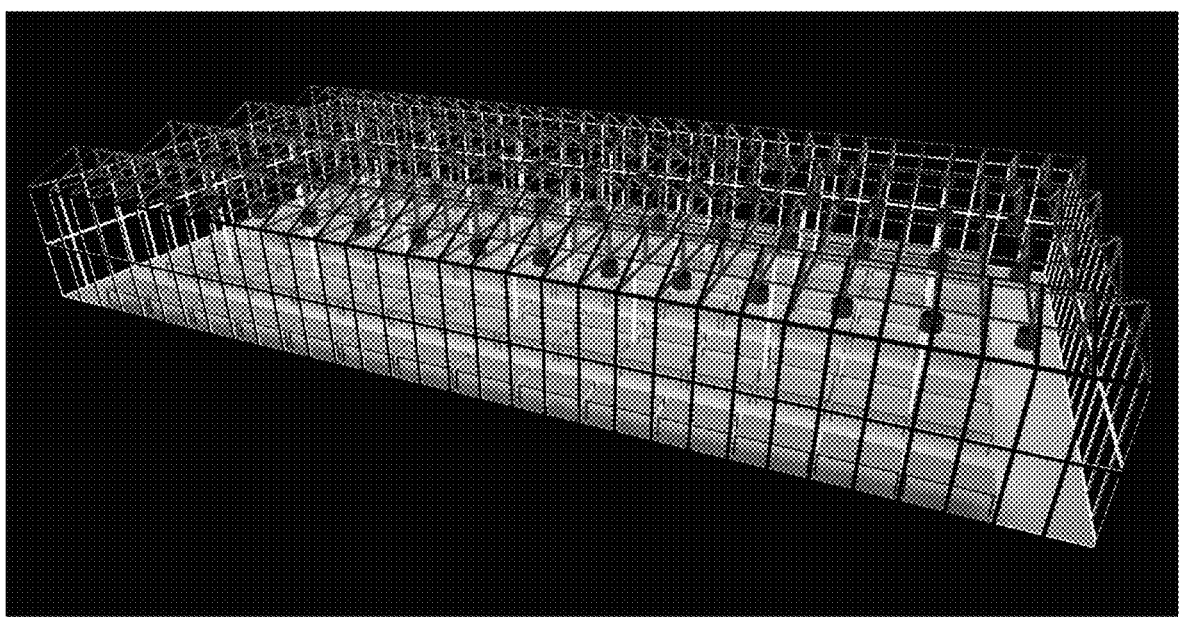
FIG. 11 shows a photorealistic rendering of the light distribution in a Venlo roof greenhouse.
Figure 12:
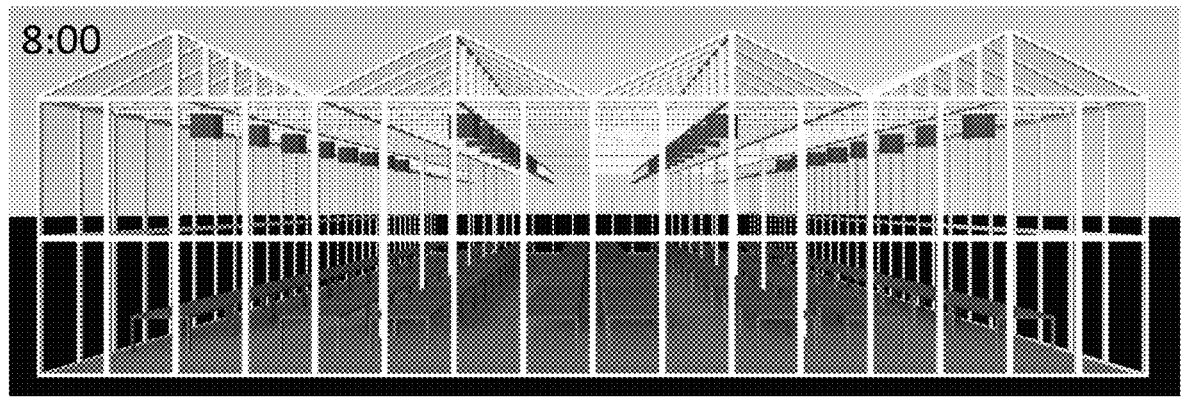
FIGS. 12-17 show the visualized distribution of daylight as determined from a TMY3 weather file on a given date at two-hour intervals.
Figure 13:
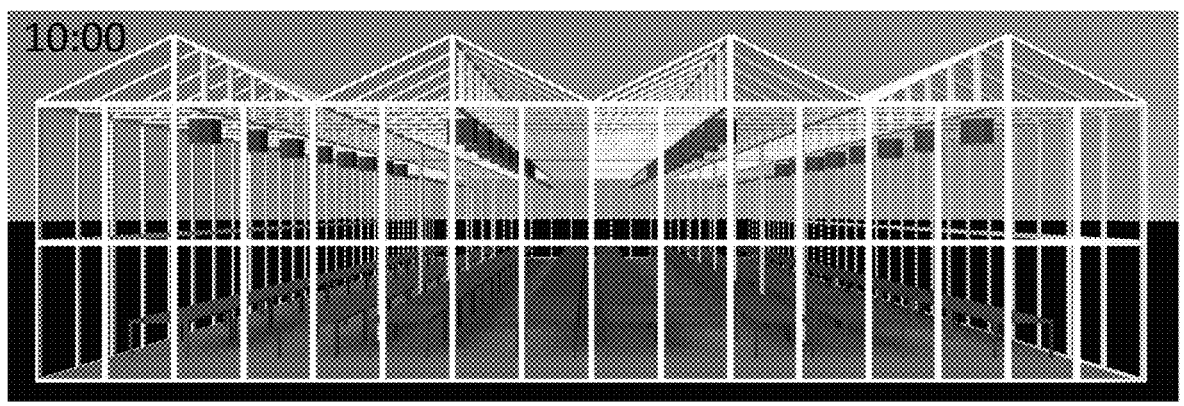
Figure 14:
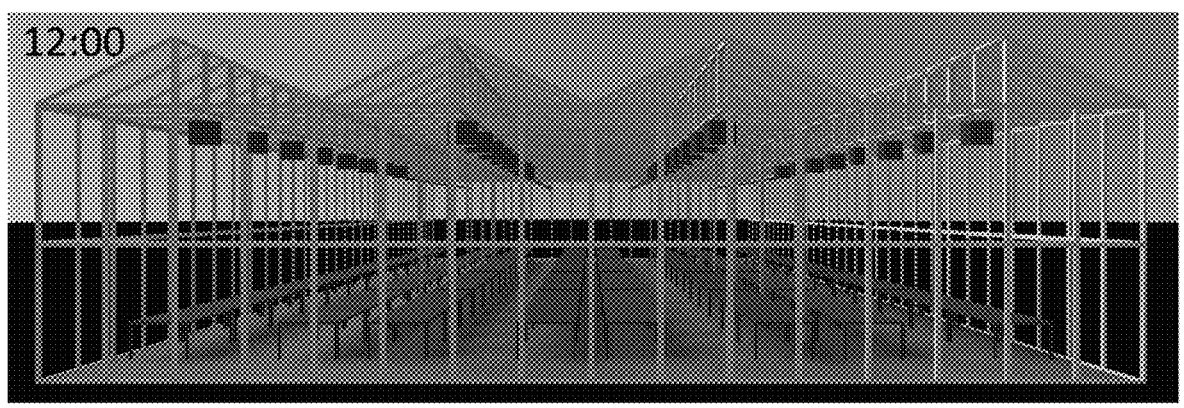
Figure 15:
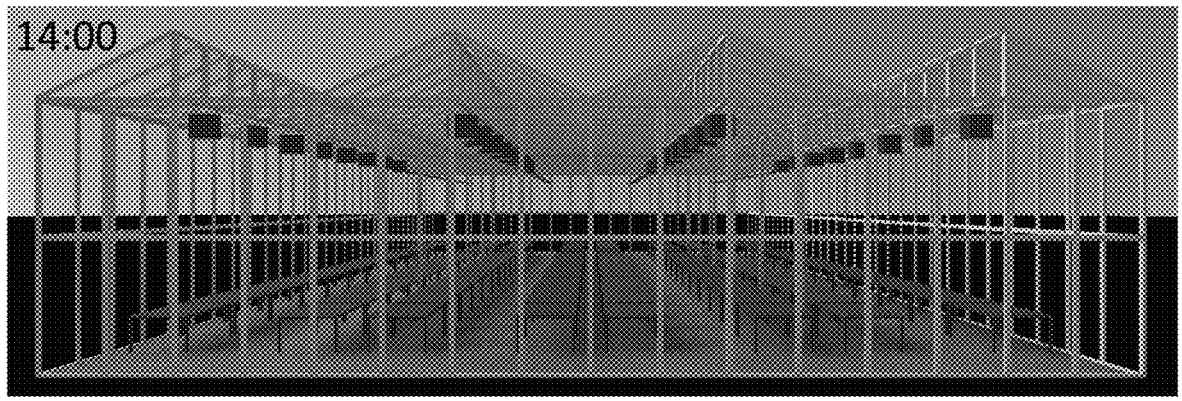
Figure 16:
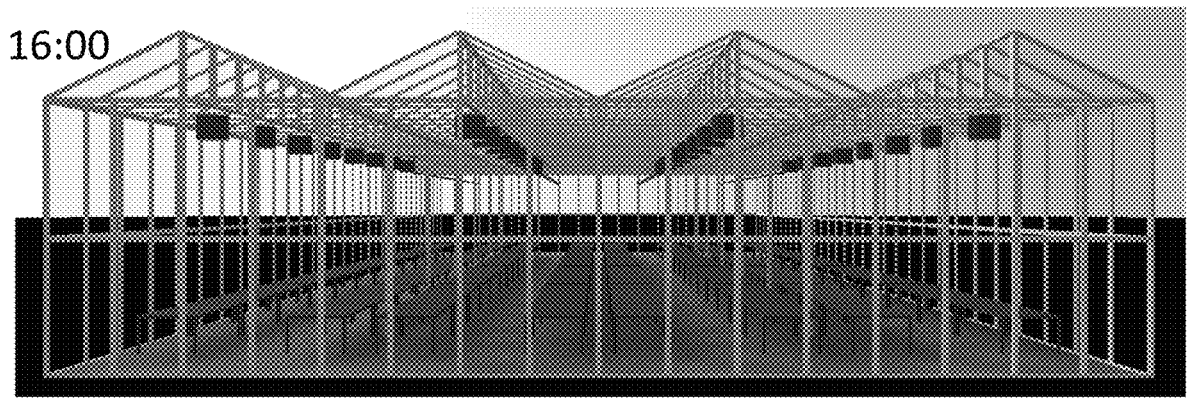
Figure 17:
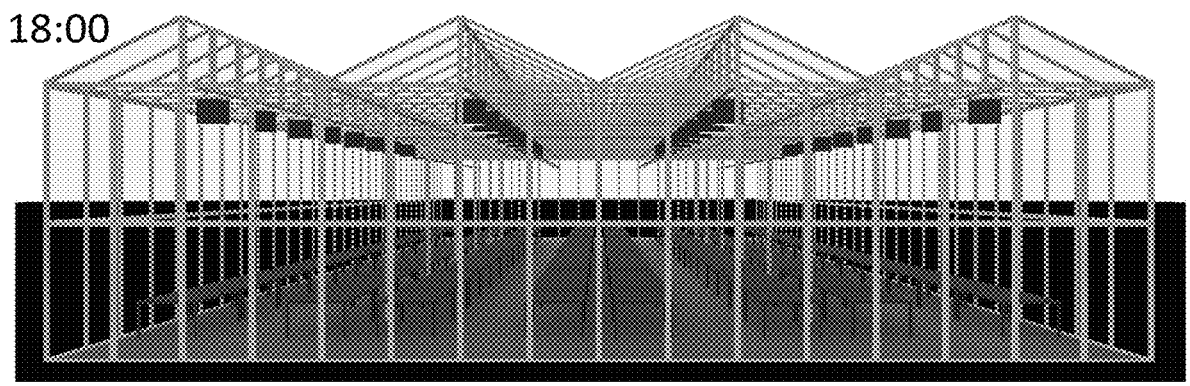

Lighting calculations may include, for example, the building structure and plant tray geometries, material spectral reflectance properties of the structural components, floor, and plant trays, spectral reflectance properties of the crops or ornamental plants, and spectral transmittance and reflectance properties of the glazing materials. (FIG. 11 shows a photorealistic rendering of the calculated light distribution in an example Venlo roof greenhouse design, which may also be delivered to the remote client 105 for display to the user.)

The lighting calculations may also include climate-based annual daylight information, based on World Meteorological Organization TMY3 (Typical Meteorological Year 3) or similar weather files for the nearest weather station for the proposed greenhouse. FIGS. 12-17 show a Venlo roof greenhouse aligned on the east-west axis and located in Vancouver, Canada. A TMY3 weather file provided the hourly weather conditions as measured on Mar. 25, 1970, from which the distribution in the greenhouse was calculated for two-hour intervals from 8:00 AM to 6:00 PM.

The simulation module 130 may also perform CFD or similar calculations upon the virtual representations for air flow and heat transfer analysis, including the effects of solar insolation in the visible and infrared regions of the optical spectrum upon the plant, soil, and building structure temperatures.

In Step 230, the spatial distributions of environmental conditions, such as for example natural daylight, supplemental electric lighting, and air flow, are measured using a dense array of virtual sensors implemented by sensors module 135. The measured values are also saved for later use in Step 245.

Regarding sensors, the user may specify the positions and orientations of one or more virtual sensors, such as for example photosynthetically active radiation (PAR) sensors for the measurement of daylight and/or supplemental electric light in greenhouses. In another example, an array of soil temperature and humidity sensors may be used to measure the effects of solar insolation using historical hourly weather conditions as determined from the site-specific TMY3 weather file.

In Step 235, controls module 140 generates output control signals for virtual hardware, such as for example motorized shades and energy curtains, supplemental electric lighting, HVAC equipment, and carbon dioxide dispensers, wherein said control signals determine the environmental parameters and conditions for the next time step. The output control signals are intended to maintain or provide desired values of the environmental parameters and are calculated using the results of Steps 225 and 230.

In Step 240, the time step is incremented. If there are more time steps to be simulated, the method returns to Step 225; otherwise it proceeds to Step 245.

In another embodiment, the training set may comprise sub-hourly intervals generated from the hourly TMY3 weather file records by means of the stochastic Skartveit-Olseth algorithm as discussed, for example, in Walkenhorst et al, 2002, "Dynamic Annual Daylight Simulations Based on One-Hour and One-Minute Means of Irradiance Data," Solar Energy 72(5):385-395.

In another embodiment, the training set may incorporate target peak demand energy consumption limits such as discussed for example, in Chinnis et al., 2012, "A Comparison of Lighting Energy Modeling Methods to Simulate Annual Energy Use and Peak Demand," Leukos 9(2):109-126. The energy consumption limits model, for example, inputs from utility power meters.

In another embodiment, and with specific reference to architectural buildings, the training set may incorporate a stochastic occupancy schedule such as, for example, that described in Reinhart, 2004, "Lightswitch-2002: A Model for Manual and Automated Control of Electric Lighting and Blinds," Solar Energy 77(1):15-28, wherein a simulation model of occupant behavior determines the target illuminance values and blinds operation on an hourly or sub-hourly basis.

In another embodiment, and with specific reference to architectural buildings, the training set may specify maximum Daylight Glare Probability (DGP) values for selected locations and orientations within the interior environment to minimize visual glare and help optimize occupant comfort, using a methodology such as that described in Jakubiec et al., 2016, "A Concept for Predicting Occupants' Long-Term Visual Comfort within Daylit Spaces," Leukos 12(4):185-202.

Given all of these optional inputs, it may be that a single set of hourly or subhourly weather records may be insufficient to reliably train the controller. To counteract this problem, multiple sets of hourly or subhourly weather records may be generated, wherein the stochastic models for the subhourly daylight data and occupancy schedules may be randomly varied.

In another embodiment, a daylight photosensor may be comprised of a multielement sensor array with an associated optical component, such that output from the sensor comprises a set of values representing an image of the environment. The controller 145 then has the option of selectively weighting the value of each sensor element such that the field of view and spatial sensitivity distribution of the sensor may be dynamically varied. For example, the distribution of direct sunlight will vary throughout the day and year, dependent on the solar position. Rather than relying on a single photosensor value, the controller may be trained to associate the direct sunlight patterns on illuminated surfaces within its field of view with desired target illuminance values and hence luminaire dimmers and fenestration settings. By dynamically changing the sensor fields of view and spatial sensitivity distributions, the controller can optimize the photosensor responses for different times and dates.

In another embodiment, the multielement sensor array may comprise a hyperspectral (e.g., trichromatic) image with multiplicities of separate color (e.g., red, green, and blue) pixel sensors. The controller may be trained to associate colors of static architectural elements within its field of view while ignoring transient architectural elements or moving objects (including occupants) with different colors.

For time-sequence simulations, such as for example the calculation of climate-based annual daylight simulations on an hourly basis, or the simulation of HVAC equipment with inherent time lags between heating or cooling and controlled environment temperature, virtual controller 145 may process the sensor measurements and generate control signals that are processed by controls module 140. As an example, controller 145 may implement one or more control algorithms with setpoints, hysteresis, and negative feedback, or proportional-integral-derivative (PID) control algorithms, that modify the output of greenhouse heaters and fans, or which open and close solar shades and energy curtains in response to sensor input signals. These changes in the environment state may then be fed back to simulation module 130 for the next hourly simulation.

Alternatively, simulation module 130 may calculate multiple simulations in parallel with different environment states, such as for example a greenhouse with solar shades. One set of hourly simulations with the shades open is calculated for the entire year, while another set is calculated with the shades closed. Multiple sets may further be calculated if the shade control is grouped into zones. When the sensors module 135 is used to calculate hourly time sequences, the relevant hourly simulation according to whether the control module has commanded the virtual shades to be open or closed can be accessed.

In Step 245, the saved measurements of the dense sensor array are clustered using known clustering analysis algorithms, such as the k-means clustering algorithm. For example, the measurements from the second horizontal grid of PAR sensors may be clustered, with the geometric centers of the clusters being used to define the position and orientation of a sparse array of virtual sensors, wherein each sensor may optionally be automatically or manually repositioned so as to be later installed in the physical environment in a practical manner.

In Step 250, the virtual environment is again initialized with the initial environment parameters and the initial time step. These initial environment parameters are the same ones as used in Step 220.

In Step 255, the simulation performs simulation calculations upon the virtual representation of the controlled environment.

In Step 260, the spatial distributions of environmental conditions are measured using the sparse array of virtual sensors.

In Step 265, controls module 140 generates output control signals for virtual hardware. The output signals are based on the results of Steps 255 and 260.

In Step 270, the time step is incremented. If there are more time steps to be simulated, the method returns to Step 255; otherwise it proceeds to Step 275.

In Step 275, training of virtual controller 145 proceeds by first initializing the controller with one or more fixed control algorithms in accordance with common industry practices. For example, a PID control algorithm may be implemented that receives input signals from one or more virtual air temperature sensors and outputs control signals to heating equipment and ventilation fans so as to maintain the air temperature within predetermined limits.

As the time sequence of hourly simulations, which include results of steps 230, 255, 260 and 265, is presented to the controller, an AI algorithm, such as for example a deep neural network, learns to recognize patterns in the variation of air temperature over time, and to dynamically adjust the PID control algorithm parameters so as to maintain constant air temperature. The time sequence of simulations may be executed multiple times, possibly with random noise added to the hourly weather data used by simulation module 130, to train the controller.

More specifically, the neural network is trained to correlate the set of sparse sensor measurements with the set of dense sensor measurements while striving to maintain the set of dense sensor measurements within predetermined limits by means of adjusting the controlled hardware over time.

In another embodiment, the neural network may also be logically connected to a rule-based expert system such as for example, a knowledge base and a forward-chaining inference engine, wherein the input data is first processed by a rule-based expert system. As one example, the inputs from timers may be expressed as expert system rules to disable controller outputs according to a predetermined building occupancy schedule. In general, the expert system may be employed to implement binary decisions, while the trainable neural network system may be employed to implement analog functions.

A corollary of this training is that given time sequences of sensor measurements such as for example, PAR sensor measurements derived from the calculation of climate-based annual daylight simulations on an hourly basis over the period of a year, the controller will learn to recognize temporal patterns in the measurements and so be able to predict the following sets of hourly measurements for a given sequence. As one simple example, a trained greenhouse controller will be able to predict sunrise and sunset after having observed several days of hourly measurements, regardless of the time of year.

C. Physical Controller

Figure 18:
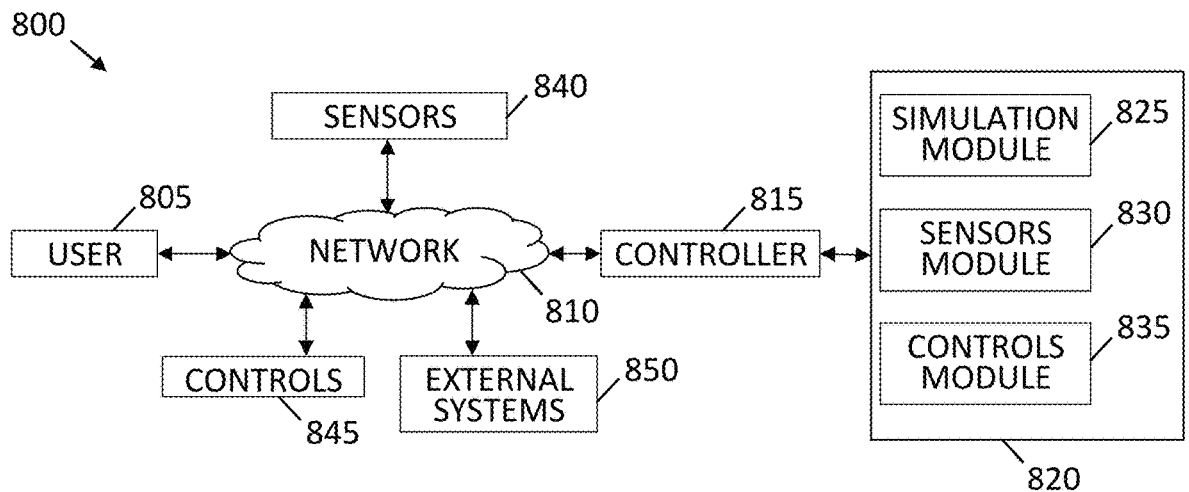
FIG. 18 shows a schematic diagram of a system for automatically generating supervised training data for a physical AI-based controlled environment controller.

In another embodiment, the invention comprises a system and method for automatically generating supervised data for continually or episodically training a physical AI-based controller. As shown in FIG. 18, the system consists of a distributed control system 800 wherein a user interface 805 enables an operator to monitor and control physical controller 815 via a network 810, which may be an industrial intranet or an internet.

Controller 815 is logically connected to a set of software modules collectively identified as module container 820, which is further comprised of simulation module 825, sensors module 830, and controls module 835. The controller further communicates through network 810 with physical sensors 840, physical controls 845, and external systems 850.

External systems 850 may include, but are not limited to, another controlled environment controller, a building automation controller, a remote database, a supervisory control and data acquisition (SCADA) system, a cloud-based control and data management system, or other data processing and archival service.

Figure 19:
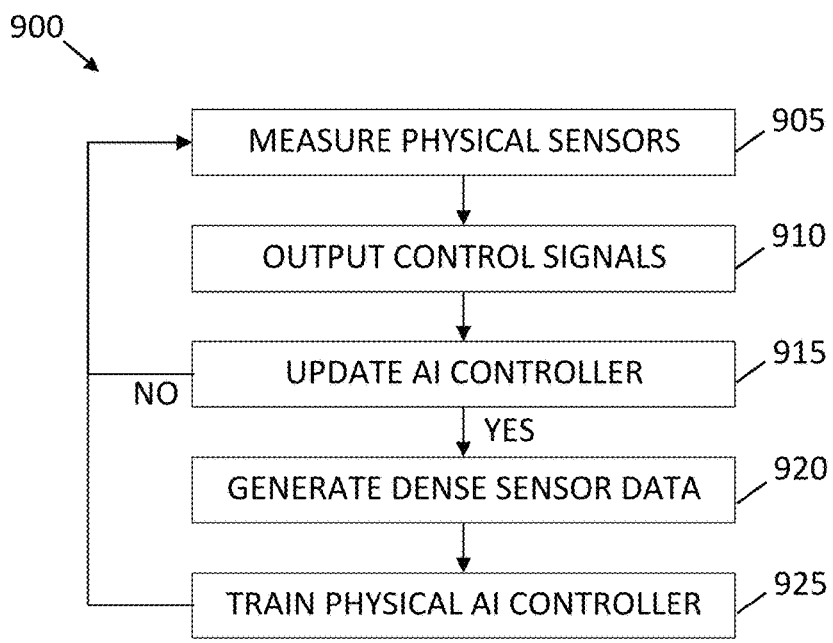
FIG. 19 shows a flow chart of a method for automatically generating supervised training data for a physical AI-based controlled environment controller.

FIG. 19 shows a second method 900, for automatically generating supervised data for continual training of physical AI-based controller 815.

In Step 905, controller 815 obtains real-time measurement data from sensors 840 via network 810.

In Step 910, controller 815 generates output signals for controls 845.

In Step 915, a decision is made on whether to update the physical AI-based controller. For example, the controller may be updated on a regular schedule such as on a daily or weekly basis. If false, the method returns to Step 905; otherwise the method proceeds to Step 920.

In Step 920, controller 815 generates a set of measurements for the virtual dense sensor array, based on the set of physical sensor measurements representing the virtual sparse sensor array, based on the correlation between the set of virtual sparse sensor array values most closely matching the current set of physical sensor values and its corresponding set of virtual dense sensor array values as determined during the training of the virtual AI-based controller.

In Step 925 the set of virtual dense sensor array measurements, together with the set of physical sensor measurements, are used as supervised data to further train controller 815 to recognize and respond to temporal sequences of physical sensor measurements.

In situations where the interior environment is similar to those in other buildings where a controller has already been trained, the present controller may be initialized with the state of the previous controller, rather than commencing training with a random initial state.

In an embodiment, and with specific reference to architectural buildings, the controller is continually trained by detecting when occupants manually override the controller outputs to the luminaire dimmers or switches and fenestration devices, sampling its real-time inputs, and updating the neural network and/or expert system with the real-time inputs and outputs as training data.

D. What-if Scenarios

In another embodiment, the controller maintains a record of past real-time inputs and predicts expected future real-time inputs. It may then generate "what-if" scenarios of different corresponding outputs to determine the best responses for satisfying long-term targets (i.e. targets that are based on time periods that are considerably longer than the time intervals of the flow charts).

As one example, the opening and closing of window blinds may satisfy predefined minimum and maximum daylight illuminance requirements, but the length of time the blinds are open may exceed the maximum allowable solar irradiance requirements in term of solar heat gain. The controller may then choose to update its expert system knowledge base with new rules to prioritize illuminance versus solar irradiance requirements.

As another example, the opening and closing of motorized shades in a greenhouse controller may satisfy the need to limit excess direct sunlight that may injure crops, but the length of time the shades are closed may result in the minimum daily light integral (DLI) requirements not being satisfied. By using what-if scenarios to generate different shade operation schedules, the controller may then choose a schedule that minimizes excess direct sunlight while satisfying DLI requirements.

In one embodiment, the corresponding outputs to expected future real-time inputs are derived directly from the trained physical artificial intelligence controller. In another embodiment, the corresponding outputs are generated by means of the virtual environment representation of Step 215 and the simulation techniques of Step 225 in FIG. 2.

In another embodiment, the controller 815 of FIG. 18 may communicate with an external service 850, which may be a remote data processing and archival service. Said external service may monitor, archive and analyze the performance of the trainable controller, and it may optionally update the rule base of its expert system knowledge base depending on said analysis or other factors. The external service may also provide real-time inputs, such as future weather predictions, for use in generating what-if scenarios.

We claim:

1. A system for automatically generating supervised training data for a control system for an interior environment, comprising:
   non-transitory computer-readable comprising computer-readable instructions defining:
   a simulation module, which, when processor-executed, performs simulation calculations using a three-dimensional parametric computer-aided design (CAD) model of a virtual interior environment to determine spatial and temporal distributions of environmental conditions within the virtual interior environment;
   a sensors module, which, when processor-executed, simulates virtual sensors at specified positions within the virtual interior environment and calculates predicted environmental conditions at the specified positions; and
   a controls module, which, when processor-executed, generates output control signals for representations of virtual environmental control hardware within the virtual interior environment; and
   a trainable artificial intelligence (AI) based controller that is trained by the predicted environmental conditions and the output control signals.

2. The system of claim 1, wherein the control system is a virtual control system and the interior environment is the same as the virtual interior environment.

3. The system of claim 2, comprising:
   a user interface via which said CAD model is defined; and
   a modeling module defined by the computer-readable instructions, which, when processor executed, generates said CAD model in response to user-specified parameters input via the user interface.

4. The system of claim 3, comprising a server that is connected via a communications network to:
   the trainable AI-based controller;
   the simulation module, the sensors module and the controls module; and
   a third-party data source that provides information used in defining the CAD model.

5. The system of claim 1, wherein the trainable AI-based controller is comprised of:
   a neural network; or
   the neural network and a rule-based inference engine.

6. The system of claim 1, wherein:
   the control system is a physical control system;
   the interior environment is a physical interior environment; and
   the model of the virtual interior environment is modelled on the physical interior environment.

7. The system of claim 6 wherein the trainable AI-based controller is:
   logically connected to the simulation module, the sensors module and the controls module; and
   physically connected via a communications network to:
      one or more physical sensors positioned to measure environmental conditions of the physical interior environment; and
      one or more physical control devices to generate control signals for physical control hardware in the physical interior environment.

8. The system of claim 7, wherein the physical sensors are located at positions corresponding to positions of virtual sensors in a sparse array in the virtual interior environment, wherein the sparse array represents clusters of virtual sensors in a dense array in the virtual interior environment.

9. The system of claim 6, wherein the one or more physical sensors measure conditions of a physical environment exterior to the physical interior environment.

10. The system of claim 6, wherein the trainable AI-based controller is comprised of:
    a neural network; or
    the neural network and a rule-based inference engine.

11. A method of automatically generating supervised training data for a control system for an interior environment, comprising the steps of:
    performing, by a processor, simulation calculations using a three-dimensional parametric computer-aided design (CAD) model of a virtual interior environment to determine spatial and temporal distributions of environmental conditions within the virtual interior environment;
    simulating, by the processor, virtual sensors at specified positions within the virtual interior environment and calculating predicted environmental conditions at the specified positions;
    generating, by the processor, output control signals for representations of virtual environmental control hardware within the virtual interior environment; and
    training an artificial intelligence (AI) based controller for the interior environment using the predicted environmental conditions and the output control signals.

12. The method of claim 11, wherein the control system is a virtual control system and the interior environment is the virtual interior environment.

13. The method of claim 12, comprising:
    obtaining user-specified design parameters for said CAD model;
    generating said CAD model using the user-specified design parameters and a knowledgebase of design rules;
    specifying an initial set of environmental parameters a first time;
    performing said simulation calculations a first time;
    calculating said predicted environmental conditions using measurements from a spatially dense sensor array;
    generating said output control signals a first time;
    incrementing a time step;
    deciding, a first time, whether to repeat the simulation calculations and output control signal generation with updated environmental parameters and conditions;
    clustering said measurements to generate further measurements that would be produced by a spatially sparse sensor array wherein the spatially sparse sensor array is less dense than the spatially dense sensor array;
    specifying an initial set of environmental parameters a second time;
    performing said simulation calculations a second time;
    calculating said predicted environmental conditions with the spatially sparse sensor array;
    generating said output control signals a second time;
    incrementing a further time step;
    deciding, a second time, whether to repeat the second time simulation calculations and second time control output generation with updated environmental parameters and conditions; and training a virtual AI-based controller with the second-time generated output control signals, the measurements, and the further measurements.

14. The method of claim 13, wherein the time step and further time step are determined by intervals of hourly weather files.

15. The method of claim 14, wherein direct solar and diffuse horizontal irradiance is stochastically generated from the hourly weather files at subhourly intervals and used in said calculations.

16. The method of claim 13, wherein the AI-based controller is trained using a stochastically generated occupancy schedule.

17. The method of claim 13, wherein the AI-based controller is trained using maximum daylight glare probability values for selected locations and orientations in the virtual interior environment.

18. The method of claim 14, wherein
the AI-based controller is trained using a stochastically generated occupancy schedule; and
the stochastically generated direct solar and diffuse horizontal irradiance and occupancy schedule are randomly varied to generate additional supervised training datasets for training the AI-based controller.

19. A method of automatically generating supervised training data for a physical controlled environment control system comprising the steps of:
obtaining measurements from a physical sensor array in the environment;
calculating, using the obtained measurements, control outputs for physical control hardware that controls the environment;
generating a set of spatially dense virtual sensor array values based on the obtained measurements, wherein the spatially dense virtual sensor array is more dense than the physical sensor array; and
training a physical artificial intelligence based controller in the physical controlled environment control system using the obtained measurements and the generated set of spatially dense virtual sensor array values.

20. The method of claim 19, wherein the spatially dense virtual sensor array values are generated by:
selecting a set of spatially sparse virtual sensor array values that correlate more closely to the obtained measurements than any other set of spatially sparse virtual sensor array values;
wherein the set of spatially dense virtual sensor array values corresponds to the selected set of spatially sparse virtual sensor array values; and
wherein the spatially sparse virtual sensor array is less dense than the spatially dense virtual sensor array.

21. The method of claim 19 comprising, after the calculating step and before the generating step, the step of deciding whether to repeat the obtaining and calculating steps.

22. The method of claim 19 comprising generating multiple what-if scenarios and using the what-if scenarios to determine control outputs that satisfy long-term targets.

* * * * *

UNITED STATES PATENT AND TRADEMARK OFFICE
CERTIFICATE OF CORRECTION

PATENT NO. : 11,080,441 B2
APPLICATION NO. : 16/158267
DATED : August 3, 2021
INVENTOR(S) : Ian Edward Ashdown, Wallace Jay Scott and Callum Thomas It is certified that error appears in the above-identified patent and that said Letters Patent is hereby corrected as shown below:

In the Claims

Column 15, Line 11, Claim 1, between "computer-readable" and "comprising", insert --memory--.

Signed and Sealed this
Sixteenth Day of November, 2021

Drew Hirshfeld
*Performing the Functions and Duties of the*
*Under Secretary of Commerce for Intellectual Property and*
*Director of the United States Patent and Trademark Office*